(12) United States Patent
Mizuno

(10) Patent No.: US 7,760,452 B2
(45) Date of Patent: Jul. 20, 2010

(54) DRIVING APPARATUS, OPTICAL SYSTEM, EXPOSURE APPARATUS AND DEVICE FABRICATION METHOD

(75) Inventor: Makoto Mizuno, Tochigi (JP)

(73) Assignee: Canon Kabushiki Kaisha (JP)

( * ) Notice: Subject to any disclaimer, the term of this patent is extended or adjusted under 35 U.S.C. 154(b) by 222 days.

(21) Appl. No.: 10/830,749

(22) Filed: Apr. 23, 2004

(65) Prior Publication Data

US 2004/0214483 A1 Oct. 28, 2004

(30) Foreign Application Priority Data

Apr. 25, 2003 (JP) ............................. 2003-121265

(51) Int. Cl.
*G02B 7/02* (2006.01)
(52) U.S. Cl. .................... 359/823; 359/811; 359/819
(58) Field of Classification Search ................ 359/819, 359/808, 823, 822, 811, 813, 818
See application file for complete search history.

(56) References Cited

U.S. PATENT DOCUMENTS

| 4,902,996 | A | * | 2/1990 | Takahara ................ 335/222 |
| 5,204,712 | A | | 4/1993 | Bouwer et al. |
| 5,822,133 | A | | 10/1998 | Mizuno et al. |
| 6,307,688 | B1 | | 10/2001 | Merz et al. |
| 6,870,632 | B2 | | 3/2005 | Petasch et al. |
| 2002/0163741 | A1 | * | 11/2002 | Shibazaki ................ 359/819 |
| 2003/0234989 | A1 | | 12/2003 | Oshino et al. |
| 2004/0219728 | A1 | * | 11/2004 | Kandaka ................ 438/200 |
| 2005/0078386 | A1 | | 4/2005 | Takabayashi |
| 2007/0014036 | A1 | | 1/2007 | Takabayashi |

FOREIGN PATENT DOCUMENTS

| EP | 0 503 712 A1 | 9/1992 |
| EP | 1 014 139 A2 | 6/2000 |
| EP | 1 376 183 A2 | 1/2004 |
| JP | 11-243052 A | 9/1999 |
| JP | 2002-131605 A | 5/2002 |
| JP | 2002-162549 A | 6/2002 |
| JP | 2002-350699 A | 12/2002 |
| WO | 2004/011984 A2 | 2/2004 |

OTHER PUBLICATIONS

European Search Report issued in corresponding European Patent Application No. 04252420.7 dated Aug. 20, 2009.

* cited by examiner

*Primary Examiner*—Ricky L Mack
*Assistant Examiner*—Brandi N Thomas
(74) *Attorney, Agent, or Firm*—Rossi, Kimms & McDowell LLP

(57) ABSTRACT

A driving apparatus comprising an optical element, a supporting block for supporting said optical element by contacting said optical element onto three supporting contact areas, a driving mechanism for practically connecting said supporting block to three driving contact areas and for moving said supporting block via the driving contact area, wherein a difference between an angle of each of the three supporting contact areas in a rotational direction around a rotation axis and an angle of each of the three driving contact areas corresponding with the three supporting contact areas is 10° or smaller, where the three supporting areas are substantially located on a first plane, and the rotational axis which is perpendicular to the first plane and passes through a barycenter of the three supporting contact areas.

5 Claims, 8 Drawing Sheets

DRIVING APPARATUS, OPTICAL SYSTEM, EXPOSURE APPARATUS AND DEVICE FABRICATION METHOD

This application claims priority benefits based on Japanese Patent Application No. 2003-121265, filed on Apr. 25, 2003, which is hereby incorporated by reference herein in its entirety as if fully set forth herein.

BACKGROUND OF THE INVENTION

The present invention relates generally to a fine adjusting driving apparatus, and more particularly to an apparatus that holds and finely adjust the orientation of an optical element (lens, mirror, and the like) of an exposure apparatus used for fabricating semiconductor or crystalline liquid devices.

A semiconductor exposure apparatus transfers many different patterns from an original form (or reticle) onto a silicon wafer (or substrate). It is therefore necessary to not only promote resolution performance but also superimposing performance, in order to make a fine integrated circuit.

Superimposing error in a semiconductor results from alignment error (i.e. alignment error between the reticle and wafer), image distortion, magnification error and the like. The alignment error may decrease by adjusting the position between the original form (or reticle) and the substrate (or wafer). On the other hand, by moving a part of an optical element in an optical system, the image distortion and the magnification error may decrease. When the optical element does not move in the desired direction, is decentered, and inclines before the part of the optical element moves, it is difficult to achieve the desired optical performance (i.e. optical performance corrected in the image distortion and magnification error). For example, when the optical element moves to an optical direction, decentering error and gradient error elements should not increase.

An apparatus for moving an optical element in a conventional semiconductor exposure apparatus uses a parallel leaf spring apparatus (U.S. Pat. No. 5,822,133) or an apparatus using a parallel link mechanism (U.S. Patent Publication No. 2002/163741).

However, in the above cases, the moving apparatus utilized for moving an optical element requiring fine surface accuracy, transmits force to the optical element when moving the optical element. When applied to the optical element, the local force deforms the optical element and degrades optical performance. Accordingly, a holder that holds the optical element, should be arranged between the optical element and the moving apparatus (e.g. part for generating driving power) to prevent force.

Even if the holder is arranged between the optical element and the moving apparatus, a deformation of the optical element increases when a position on which the moving apparatus applies force to the holder and a holding position on which the holder holds the optical element are as described by FIG. 2 of U.S. Patent Publication No. 2002/163741, i.e. the relation between a position on which the moving (driving) apparatus applies force to the holder differs from a position on which the holder holds the optical element by 60° around an optical axis.

Accordingly, it is an exemplary object of the present invention to provide a driving apparatus (i.e. holder) of an optical element for reducing the face deformation of the optical element during translation, decentering adjustment and gradient adjustment of the optical element, and an optical apparatus (i.e. general optical apparatus such as an exposure apparatus, astronomical telescope and the like) which includes this driving apparatus.

BRIEF SUMMARY OF THE INVENTION

A driving apparatus which includes an optical element, a supporting block for supporting said optical element by contacting said optical element onto three supporting contact areas, a driving mechanism for practically contacting said supporting block to three driving contact areas and for moving said supporting block via the driving contact area, wherein a difference between an angle of each of the three supporting contact areas in a rotational direction around the rotation axis and an angle of each of the three driving contact areas corresponding with the three supporting contact areas is 10° or smaller. The three supporting areas are substantially located on a first plane. A rotational axis, perpendicular to the first plane, passes through a barycenter of the three supporting contact areas.

An exposure apparatus of another aspect according to the present invention includes the above driving apparatus, wherein the exposure apparatus exposes an object by introducing light from a light source via the optical element to the object.

A device fabricating method of still another aspect according to the present invention includes the steps of exposing the object, and developing the exposed object.

DETAILED DESCRIPTION OF THE PREFERRED EMBODIMENTS

With reference to the accompanying drawings, a description will now be given of embodiments according to the present invention.

First Embodiment

A description will now be given of an optical element driving apparatus with reference to FIG. 1 and an exposure apparatus using it with reference to FIG. 2. The exposure apparatus shown in FIG. 2 is, for example, a reduction exposure apparatus (i.e. EUV exposure apparatus) using EUV light with wavelengths of about 10 to 15 nm (suitability, 13 to 14 nm). This apparatus includes a emitting apparatus (or a light source apparatus), illuminating optical system (not shown) for illuminating a reticle by using light from the emitting apparatus, and a reflection type projecting optical system for introducing the light via the reticle to a wafer and for projecting and exposing a pattern of the reticle onto the wafer.

The projecting optical system or the illuminating optical system of the exposure apparatus contains a holder (a holding system) which holds an optical element 1 (i.e. a mirror). The optical element's position is the adjusted so as to satisfy optical character. In other words, translation, decentering adjustment and gradient adjustment is executed.

Figure 1:
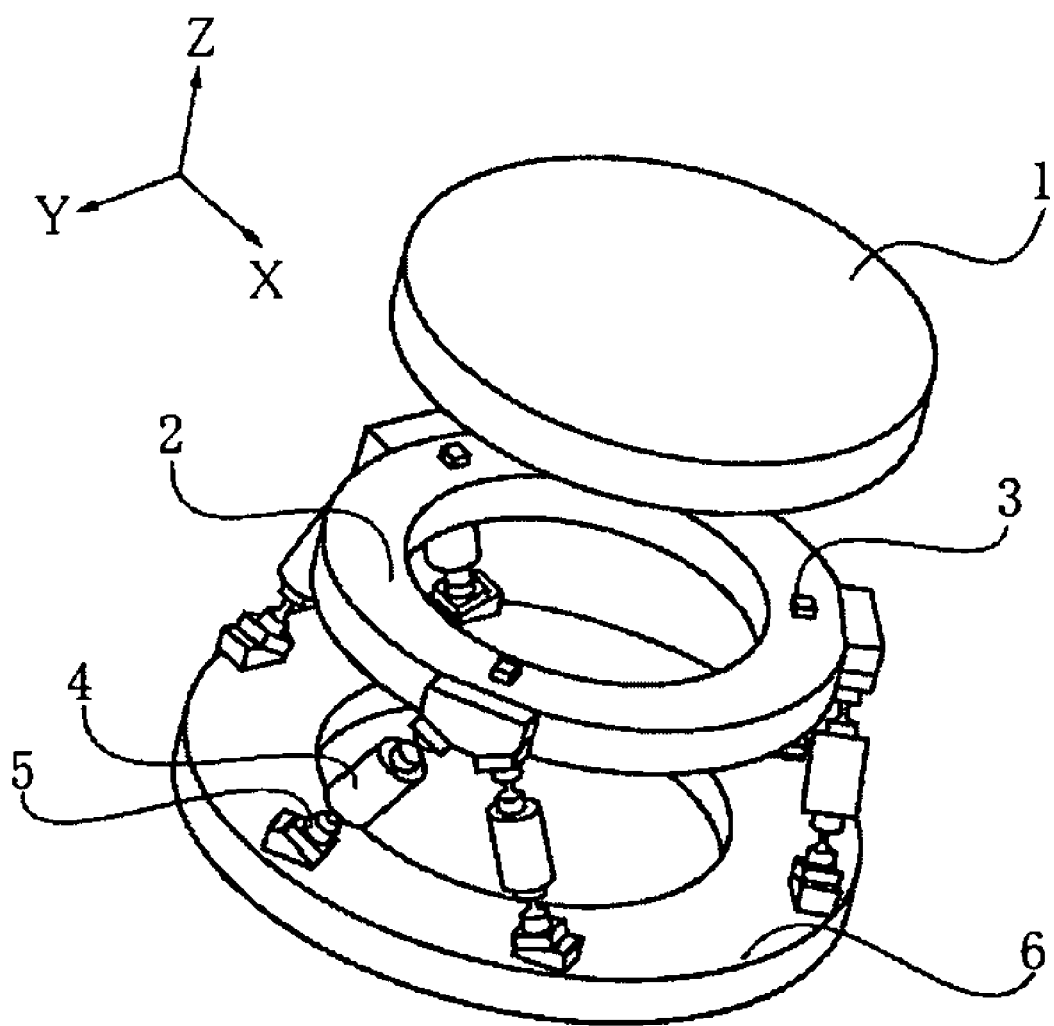
FIG. 1 is an asquint schematic view of an optical element holding adjuster.
Figure 2:
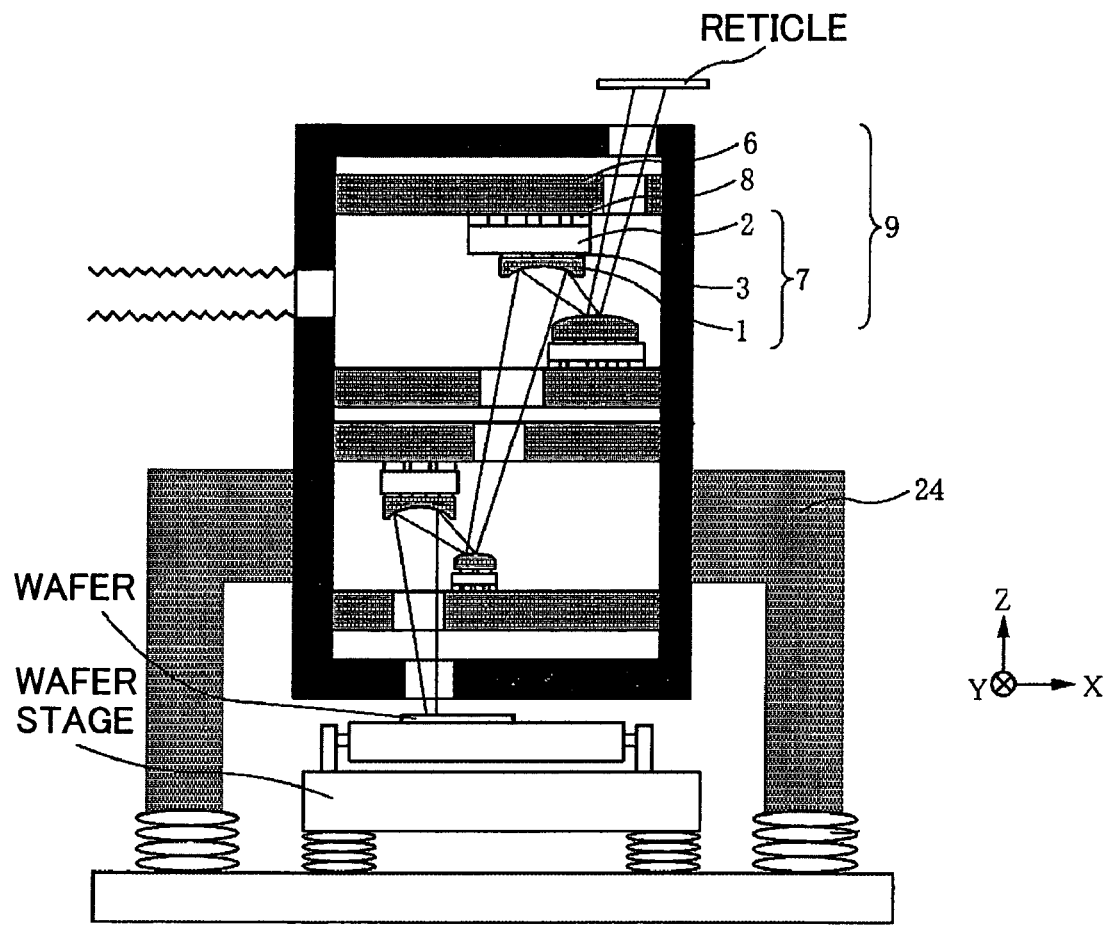
FIG. 2 is a whole view of an exposure apparatus with the optical element holding adjuster mounted.

FIG. 1 is one embodiment of an optical element holding/adjusting system 9. An optical element 1 is held by a supporting block 2 via three holders 3 (in this case, the holder 3 may have three or more positions). A barycenter of a geometric triangle formed by the three holders 3 (When the holder holds the optical element by finite areas, a barycenter is formed by the finite areas. When one holder contacts the optical element at plural points, a spatial barycenter is formed by these points.) desirably corresponds with a barycenter of the optical element 1 (when not corresponding with it, both error rate is within a half squared plus the above triangle area divided by ten) except for directions perpendicular to a plane formed by a triangle in distribution of supporting weight.

Desirably, the holder 3 should be fabricated so that the holder 3 can contact with the optical element 1 by point, face or line. When contacting the optical element by point, the holder 3 is a pin or a sphere. However, when the holder 3 contacts the optical element by line or face, it is necessary to fabricate the holder 3 based on a back side of the optical element 1. The holder 3 uses three combinations of spheres and V-shaped grooves (i.e. two points of contact) in order to prevent deformation by thermal expansion of the optical element 1 and the like, and to advance assembly duplicability. It may also use other embodiments to fitly combine a convex and concave part. For example, there are other kinematical mounting methods including a sphere and a V-shape groove, a sphere and a cone (conical concave part), a sphere and pyramid concave part, and a sphere and a plane. Here, a holder for contacting an optical element and a support block at two points uses a sphere and a V-shaped groove, on one curve uses a sphere and a cone, at plural points uses a sphere and a pyramid's concave part, at one point uses a sphere and a plane, and at one point uses a peak part and a plane or a curved surface. Further, the contact area may have two finite areas for arranging a convex part and a concave part for matching the shape of a nearly sphere on the nearly sphere and the contact area.

An adjuster 8 shown in the present embodiment is generally a bipod type parallel-linked mechanism which includes, for example, an elastic hinge 5 and a linear actuator, and is connected by three linking parts (a driving part) to a supporting block 2 (the linking part may have three or more positions). These linking parts may have various combinations similar to the above holders.

This parallel link mechanism can drive (or adjust a position) a movable part 7 (i.e. the supporting block 2, holder 3 and optical element 1) in six axis directions (six variations) on a base block 6 when six actuators (preferably two actuators per one parallel link mechanism) operate to respectively arbitrate and adjust the three positions of the linking part. The actuator 4 may use not only a laminated piezoelectric element but also a fluid actuator such as a cylinder and a bellows, a motor, or a feed screw. The output of actuator 4 may be amplified or reduced based on the driving area and driving accuracy requirements of the optical element 1. Here, the movable part 7 is measured about a position and an attitude by a positioning meter (not shown) arranged on the base block 6 or a structure frame 24. It is controlled, by adjusting the output of the actuator 4, in order to acquire the desired position and attitude.

A barycenter of a triangle formed by three linking parts (i.e. a barycenter position of the contact area in each of the linking parts, or a midpoint or a barycenter position of plural contacting points) corresponds with a geometric barycenter (or optical axis) of the optical element 1, or a barycenter of the whole movable parts 7 which includes the optical element 1, the supporting block 2 and holder 3 except in a direction perpendicular to a plane formed by the above triangle (both error rate are within a triangle, which is formed by the three linking parts area, half squared divided by ten).

A method for directly driving a movable part so that the above parallel link mechanism transmits force to the supporting block 2 and the optical element 1 deforms the function surface of the optical element 1. Therefore, the deformation level should be decreased because optical performance cannot be satisfied.

Figure 3B:
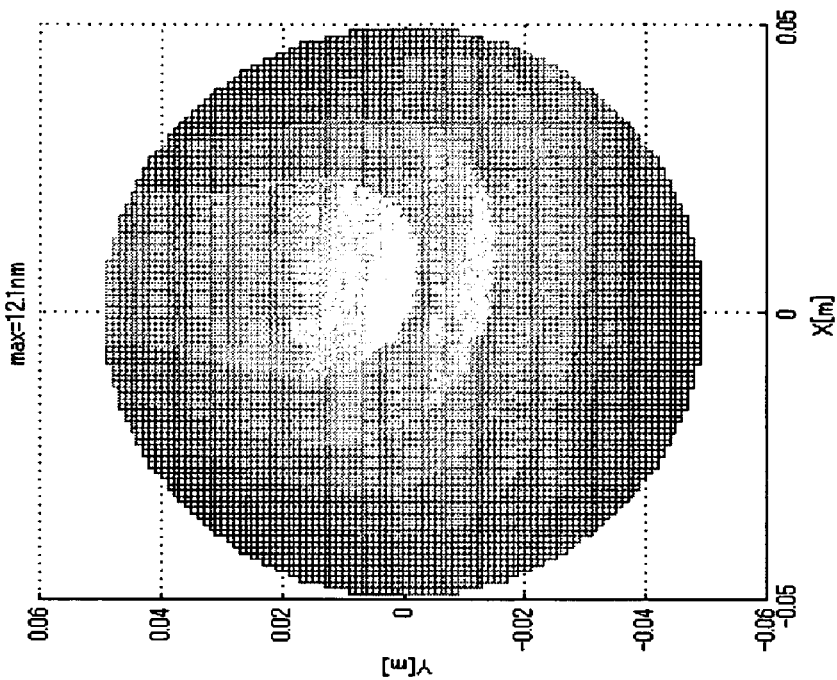
FIG. 3 is a view that shows the deformation distribution in an optical element surface when an optical element moves in the Z-axis direction.
Figure 3A:
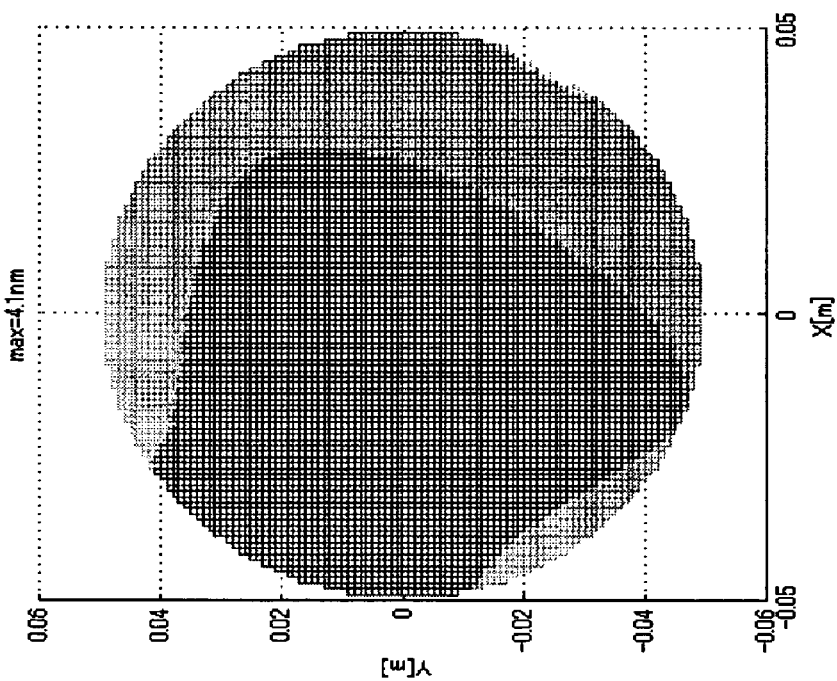
Figure 4A:
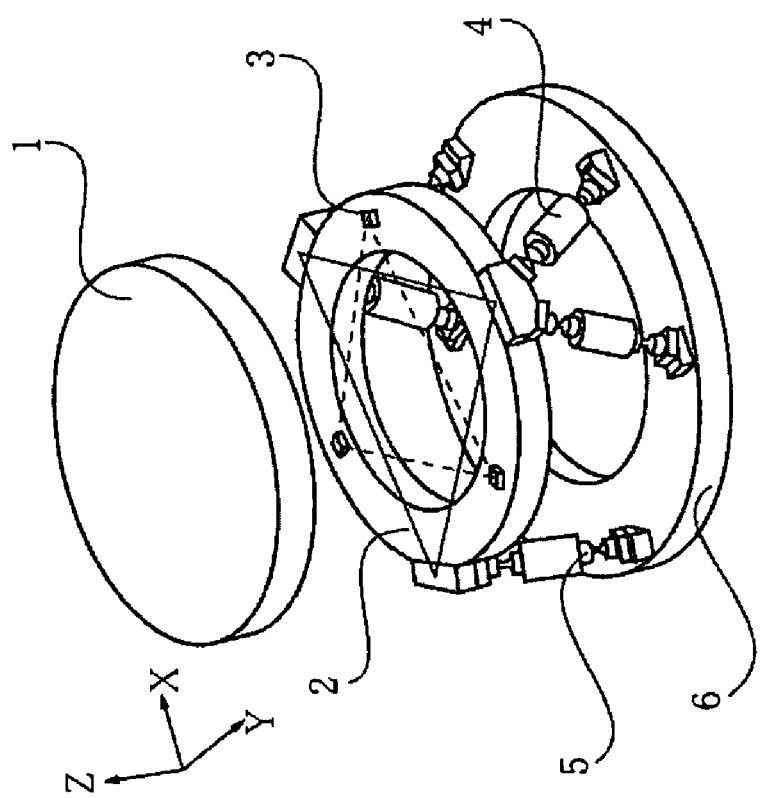
FIG. 4 is an arrangement view of an adjuster and holder.
Figure 4B:
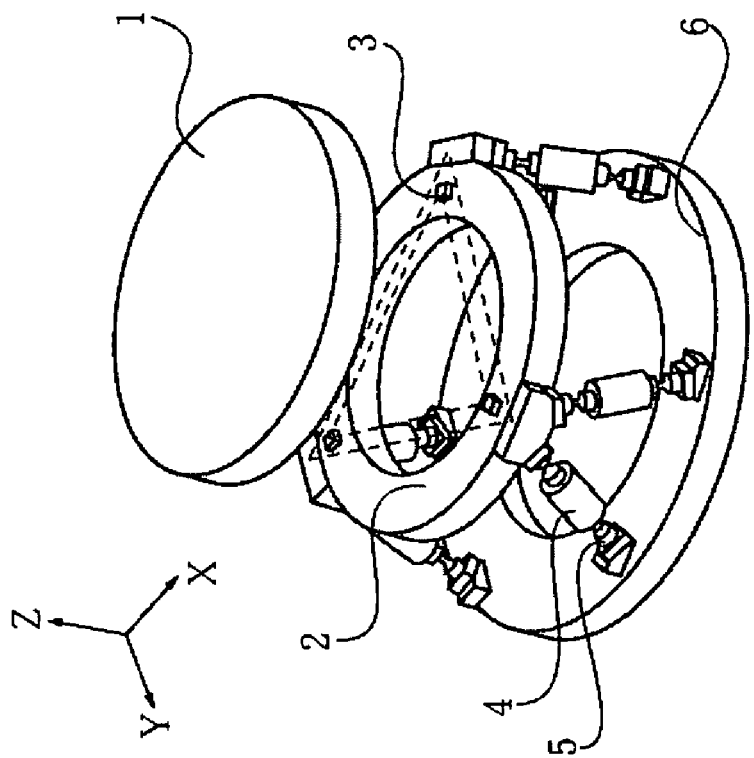

The optical element 1 has large deformation level depending on the arrangement of the holder 3, when three positions are connected to the supporting block 2 and the adjuster 8, FIG. 3A shows a deformation distribution of finite-element analysis result in an optical element surface (or a reflecting surface in case of a reflecting part) after the optical element 1 moves in a Z-axis direction when a part for linking the supporting block of the adjuster 8 (i.e. the above linking part) nearly corresponds with the holder 3, i.e. when the triangle formed by the three linking parts shown in FIG. 4A is in nearly the same direction as a triangle (shown by dotted line in FIG. 4A) formed by the three holders 3 (both triangles nearly correspond about the vertices directions). Maximum value of deformation is 4.1 nm in the optical element surface shown in FIG. 3A.

Here, the holder means points, which contacts the optical element and the optical element's supporting block, and has three points in the instant embodiment. Of course, each of the three contacting points is not limited to a contact point. The contact point may include a contact area with a finite area, plural points, plural contact areas and the like. In this case, each of three contact points may include a barycenter position of each contact area, plural points and plural contact areas. The linking part is similar to the holder, and may mean three contact points (a contact point may be plural points, a contact area with a finite area, plural contact areas.) contacted to the supporting block and the parallel link apparatus (or the driving apparatus).

Here, the "vertex directions of both triangles nearly corresponds", i.e. it means that in the instant embodiment, the holder is required to be in nearly the same position as the linking part. A rotational axis is a line which passes through a barycenter of a triangle formed by three holders and is perpendicular to a plane with the triangle, a line which passes a barycenter of an optical element and is perpendicular to a optical surface of the optical element, a rotational center axis in a predetermined surface with an optical surface of an optical element, or an optical axis of an optical system with the optical element. Then, a difference between an angle of each of the three holders in a rotational direction around a rotational axis and an angle of each of the three linking parts corresponding with the three holders in the rotational direction around the rotational axis is 10°, preferably, 3° or smaller. This means that the above requirement that the "vertex direction of both triangles nearly corresponds" is important for achieving a structure for driving an optical element and for reducing the deformation of an optical element. In other words, as described above, a triangle formed by the three linking parts is in nearly the same direction as that formed by the three holders.

Figure 8:
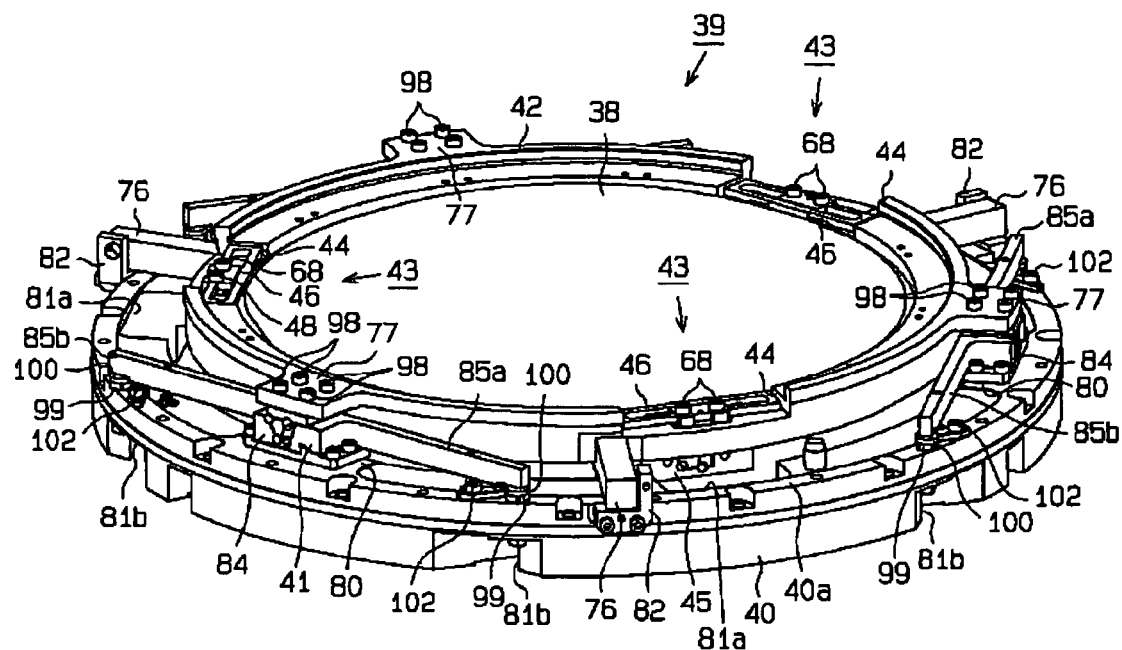
FIG. 8 is a view for explaining a conventional optical element holding adjuster (U.S. Patent Publication No. 2002/163741).

FIG. 3B shows the deformation distribution of finite-element analysis result in an optical element surface (or a reflecting surface in case of a reflecting part) after the optical element 1 moves in a Z-axis direction when a position of a part for linking the supporting block of the adjuster 8 (i.e. the linking part) nearly differs from that of the holder 3 (i.e. the holder 3 is arranged between the linking part), i.e., when a triangle formed by three linking parts has a half cycle difference about the vertex direction with a triangle formed by the three holder 3. (A geometric barycenter of a triangle differs from its center by 180° in a rotational direction and is similar to a cited reference described in FIG. 8.). Maximum value of deformation is 12.1 nm in the optical element surface shown in FIG. 3B.

In FIG. 3 the darker part means a higher surface deforming position. The maximum value of a deformation is described on top of each figure, FIG. 3A and 3B. FIGS. 3A and 3B show the surface deformation of the optical element 1 when the linking part is arranged on the same position as the holder 3 is higher than when the linking part is arranged on a position different from the holder 3.

Figure 5B:
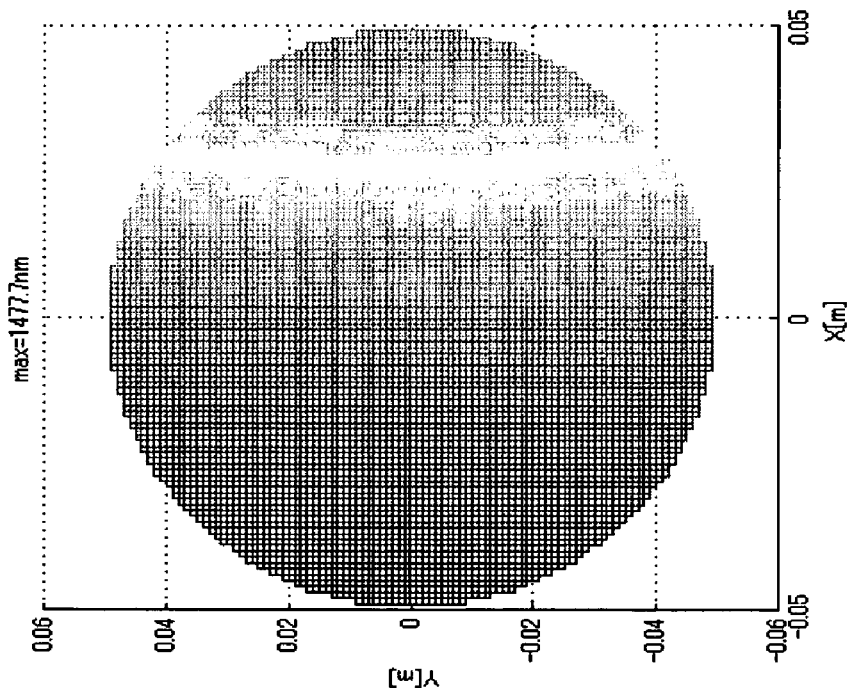
FIG. 5 is a view that shows the deformation distribution in an optical element surface when an optical element moves in the Y-axis direction.
Figure 5A:
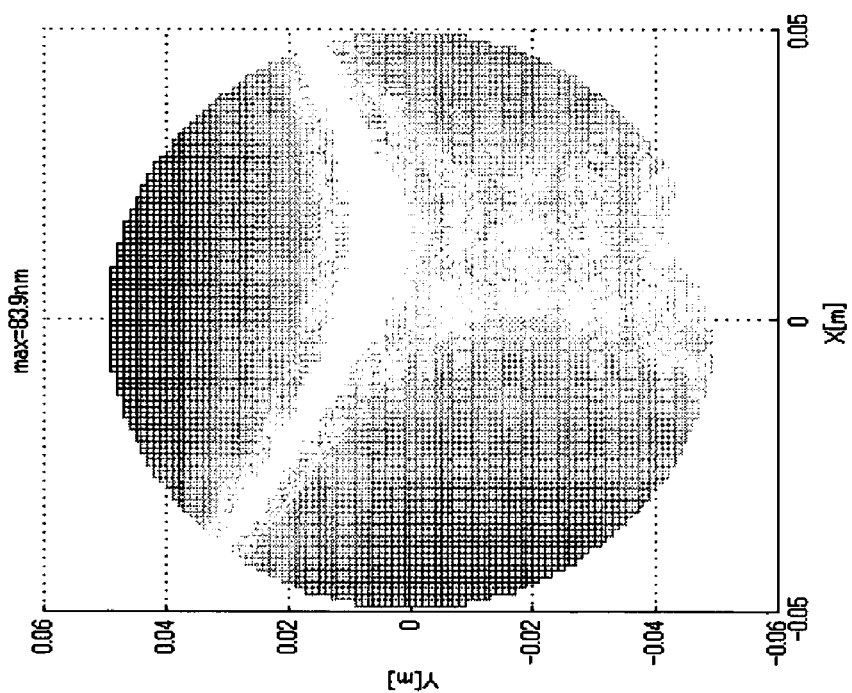

FIG. 5A shows deformation distribution of finite-element analysis result in an optical element surface after the optical element moves in a Y-axis direction when each linking part is arranged in a position similar to the holder 3 (a position in which a triangle formed by the three linking parts and a triangle formed by the three holders correspond about a direction). FIG. 5B shows a deformation distribution of finite-element analysis result in an optical element surface after the optical element moves in a Y-axis direction when each linking part is arranged in a position different from the holder 3 (a position in which a triangle formed by the three linking parts differs from that of a triangle formed by the three holders by a half cycle). Here, the maximum value of the deformation is 83.9 nm in the optical element surface shown in FIG. 5A and 1477.7 nm in the optical element surface shown in FIG. 5B.

FIGS. 5A and 5B show although both distributing deformation shapes slightly differ about the Z-axis direction, the surface deformation of the optical element 1 when the linking part is arranged on the same position as the holder 3 is smaller than when the holder is arranged on a position different from the holder 3.

Thus, it is possible to lower the surface deformation of the optical element by arranging the linking part on a position similar to the holder 3.

The above instant embodiment does not limit the number and position of the linking part and the holder. When arranged with three or more positions, the holder should be arranged with each position near the linking part (the same place about direction in the optical axis of the optical element).

Although, the above description is mainly given for an optical element driving apparatus, the instant embodiment is not limit to an optical element driving apparatus. It is possible to apply the driving apparatus of the instant embodiment to the exposure apparatus shown in FIG. 2. The exposure apparatus shown in FIG. 2 describes a projecting optical system for introducing light from a reticle (or a mask) onto a wafer (an object). It does not describe an illuminating optical system for equally illuminating the reticle (or the mask) by light from a light source. Therefore, the driving apparatus of the instant embodiment may be applied to an exposure apparatus with the illuminating optical system. The optical element of the instant embodiment may be applied when an optical element in an illuminating optical system of an exposure apparatus and/or an optical element in a projecting optical system moves.

Figure 6:
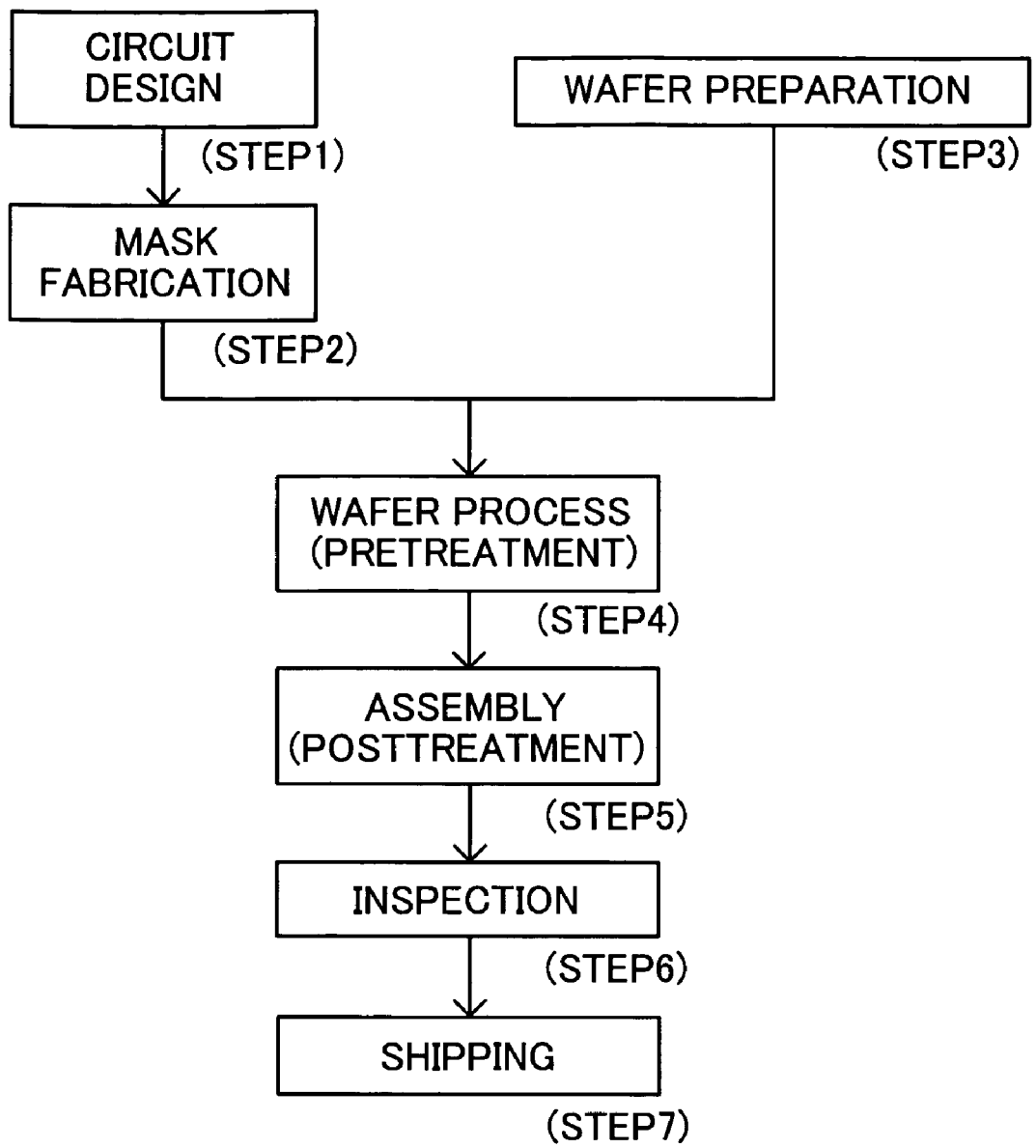
FIG. 6 is a flowchart for explaining how to fabricate devices (such as semiconductor chips such as ICs and LCDs, and the like).
Figure 7:
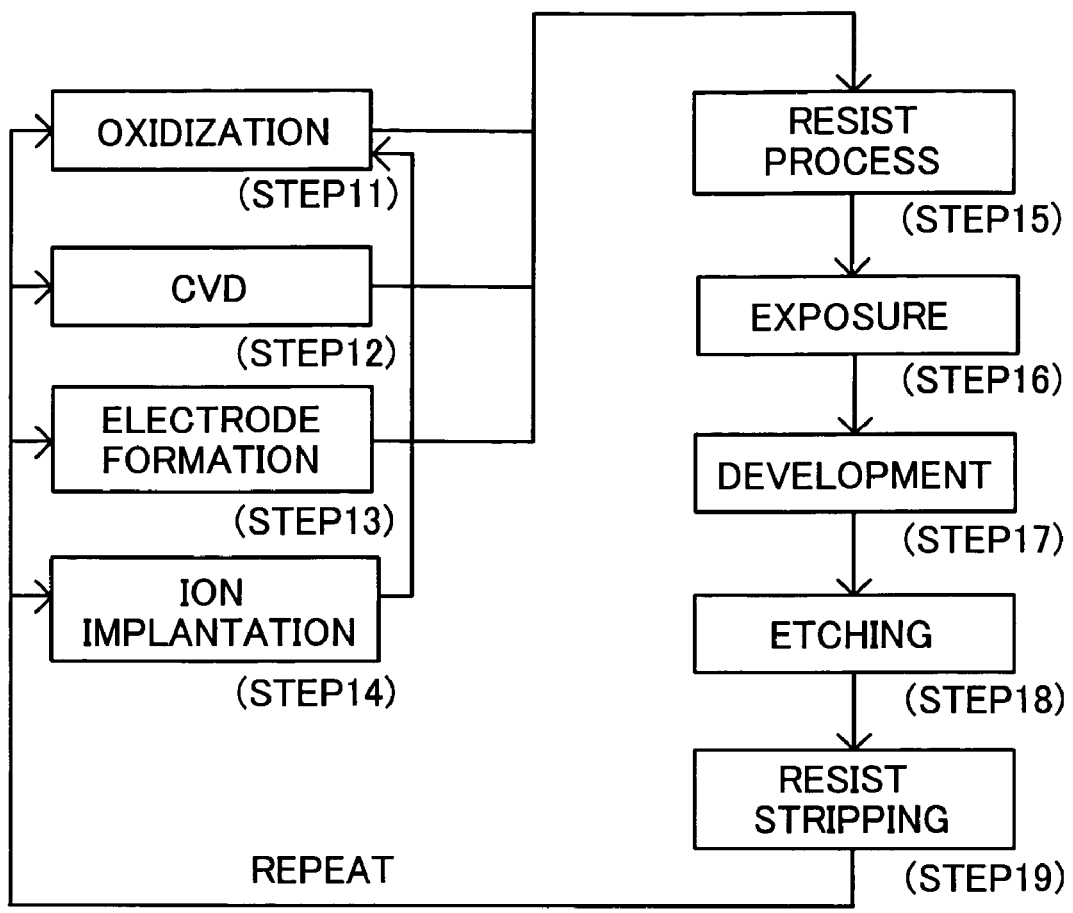
FIG. 7 is a detailed flowchart of a wafer process as shown in Step 4 of FIG. 6.

Referring now to FIGS. 6 and 7, a description will be given of an embodiment of a device fabricating method using the exposure apparatus shown in FIG. 2. FIG. 6 is a flowchart for explaining device fabrication (i.e., semiconductor chips such as IC and LSI, LCDs, CCDs, etc.). Here, as an example, a description will be given of the fabrication of a semiconductor chip. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), referred to as a pretreatment, using the mask and wafer, forms the actual circuitry on the wafer through photolithography. Step 5 (assembly), also referred to as a posttreatment, forms the wafer formed in Step 4 into a semiconductor chip and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 7 is a detailed flowchart of the wafer process in Step 4 in FIG. 6. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer. The device fabrication method of this embodiment may manufacture a higher quality device than the conventional method. The device fabrication method using the above exposure apparatus and devices as the resultant products would constitute one aspect of the present invention.

A description will be given of embodiments according to the present invention.

Embodiment 1

A driving apparatus comprising:
an optical element;
a supporting block for supporting said optical element by contacting said optical element onto three supporting contact areas;
a driving mechanism for practically connecting said supporting block to three driving contact areas and for moving said supporting block via the driving contact area,
wherein a difference between an angle of each of the three supporting contact areas in a rotational direction around a rotation axis and an angle of each of the three driving contact areas corresponding with the three supporting contact areas is 10° or smaller, where the three supporting areas are substantially located on a first plane, and the rotational axis which is perpendicular to the first plane and passes through a barycenter of the three supporting contact areas.

Embodiment 2

A driving apparatus according to embodiment 1, wherein the difference between the angle of each of the three supporting contact areas in the rotational direction around the rotation axis and the angle of each of the three driving contact areas corresponding with the three supporting contact areas is 3° or smaller.

Embodiment 3

A driving apparatus according to embodiment 1, wherein an angle between the three supporting contact areas is 110° to 130° in the rotational direction around the rotational axis.

Embodiment 4

An optical system comprising:
plural optical elements; and
a driving apparatus according to embodiment 1 that drives one of said plural optical elements.

Embodiment 5

An exposure apparatus comprising:
an optical element;
a supporting block for supporting said optical element by contacting said optical element onto three supporting contact areas;
a driving mechanism for practically contacting said supporting block to three driving contact areas and for moving said supporting block via the driving contact area,
wherein a difference between an angle of each of the three supporting contact areas in a rotational direction around a rotation axis and an angle of each of the three driving contact areas corresponding with the three supporting contact areas is 10° or smaller, where the three supporting areas are substantially located on a first plane, and the rotational axis which is perpendicular to the first plane and passes through a barycenter of the three supporting contact areas.

Embodiment 6

An exposure apparatus according to embodiment 5, wherein the difference between the angle of each of the three supporting contact areas the rotational direction around the rotation axis and the angle of each of the three driving contact areas corresponding with the three supporting contact areas is 3° or smaller.

Embodiment 7

An exposure apparatus according to embodiment 5, wherein the angle between the three supporting contact areas is 110° to 130° in rotating direction of the rotation axis.

Embodiment 8

An exposure apparatus according to embodiments 5, comprising:
an illuminating optical system for illuminating a mask by using light from a light source; and
a projecting optical system for introducing the light via the mask onto an object to be exposed,
wherein said illuminating optical system and/or said projecting optical system comprise said optical element.

Embodiment 9

An exposure apparatus according to embodiment 5, comprising:
an illuminating optical system for illuminating a mask by using light with wavelength of 10 to 15 nm from a light source; and
a projecting optical system for introducing the light via the mask onto an object to be exposed by using said optical element.

Embodiment 10

An exposure apparatus according to embodiment 5, wherein said optical element is a reflecting optical element.

Embodiment 11

An exposure apparatus according to embodiment 10, comprising:
an illuminating optical system consisting of the reflecting optical element, for illuminating a mask by using light with wavelength of 10 to 15 nm from a light source;
a projecting optical system consisting of plural reflecting optical elements comprising said optical element, for introducing the light via the mask by using the plural reflecting optical elements; and
a vacuum chamber for maintaining an area around said optical element at vacuum atmosphere.

Embodiment 12

A device fabricating method comprising the steps of:
exposing an object to be exposed by using said exposure apparatus according to embodiment 5; and
developing the exposed object.

Embodiment 13

A driving apparatus comprising:
an optical element;
a supporting block for supporting said optical element by practically contacting said optical element onto three supporting contact areas;
a driving mechanism for practically connecting said supporting block onto three driving contact areas and for moving said supporting block via the driving contact area,
wherein a difference between an angle of each of the three supporting contact areas in a rotational direction around a rotation axis and an angle of each of the three driving contact areas corresponding with the three supporting contact areas is 10° or smaller, where the three supporting areas are substantially located on a first plane, and the rotational axis which is perpendicular to the first plane and passes through a barycenter of the three supporting contact areas.

Embodiment 14

A driving apparatus according to embodiment 13, wherein the difference between the angle of each of the three supporting contact areas in the rotational direction around the rotation axis and the angle of each of the three driving contact areas corresponding with the three supporting contact areas is 3° or smaller.

Embodiment 15

An optical system comprising:
plural optical elements; and a driving apparatus according to embodiment 13 that drives said plural optical elements.

Embodiment 16

An exposure apparatus according to embodiments 13, comprising:
an illuminating optical system for introducing light from a light source to a mask; and
a projecting optical system for introducing the light via the mask onto an object to be exposed,
wherein said illuminating optical system and/or said projecting optical system comprise said optical element.

Embodiment 17

A device fabricating method comprising the steps of:
exposing an object to be exposed by using said exposure apparatus according to embodiment 16; and
developing the exposed object.

Embodiment 18

A driving apparatus comprising:
a reflecting optical element;
a supporting block for supporting said reflecting optical element by practically contacting said optical element at three points;
a driving mechanism for practically contacting said supporting block to three driving contact areas and for moving said supporting block via the driving contact area,
wherein a difference between an angle of each of the three supporting contact areas in a rotational direction around a rotation axis and an angle of each of the three driving contact areas corresponding with the three supporting contact areas is 10° or smaller, where the three supporting areas are substantially located on a first plane, and the rotational axis which is perpendicular to the first plane and passes through a barycenter of the three supporting contact areas.

Embodiment 19

A driving apparatus according to embodiment 18, wherein the difference between the angle of each of the three points in the rotational direction around the rotation axis and the angle of each of the three driving contact areas corresponding with the three points is 3° or smaller.

Embodiment 20

An optical system comprising:
plural optical elements; and
a driving apparatus according to embodiment 18 that drives one of said plural optical elements.

Embodiment 21

An exposure apparatus according to embodiments 18, comprising:
an illuminating optical system for introducing light from a light source to a mask; and
a projecting optical system for introducing the light via the mask onto an object to be exposed,
wherein said illuminating optical system and/or said projecting optical system comprise said optical element.

Embodiment 22

A device fabricating method comprising the steps of:
exposing an object to be exposed by using said exposure apparatus according to embodiment 21; and
developing the exposed object.

Embodiment 23

A driving apparatus comprising: a supporting member for supporting an optical element by plural support parts; and a driving mechanism for driving the optical element by driving plural driving parts of the supporting member,
wherein one or more of the plural supporting parts are located at positions similar to that of each of the plural driving parts.

Embodiment 24

A driving apparatus according to embodiment 23, wherein the supporting member supports the optical element, with supporting parts, at three positions.

Embodiment 25

A driving apparatus according to embodiment 23 or 24, wherein the driving mechanism drives the optical element by driving (or adjusting) three positions of driving parts in the supporting member.

Embodiment 26

A driving apparatus according to embodiment 23, wherein the supporting part has three positions, the driving part has three positions, and a triangle formed by the supporting part is similar in shape and direction as a triangle formed by the driving part.

Embodiment 27

A driving apparatus according to one of embodiments 23 to 26, wherein the supporting part has three positions, and barycenter of a triangle formed by the supporting part is similar to barycenter (optical axis) of the optical element.

Embodiment 28

A driving apparatus according to one of embodiments 23 to 27, wherein the driving part has three positions, and barycenter of a triangle formed by the driving part is similar to barycenter (optical axis) of the optical element.

Embodiment 29

A driving apparatus according to one of embodiments 23 to 28, wherein one of the driving mechanism and the driving part includes a concave part, the other driving mechanism and driving part includes a convex part, and the concave part dovetails into the convex part.

Embodiment 30

A driving apparatus according to embodiment 29, wherein the concave part is a conical, a pyramid or a V-shaped groove.

Embodiment 31

A driving apparatus according to embodiment 29 or 30, wherein the convex part is nearly spherical or partly spherical.

Embodiment 32

A driving apparatus comprising plural of: a holder for holding an optical element; a supporting block for supporting the holder; an adjuster for driving fixed multiple-spindlely parts of the supporting block,
  wherein the optical element connects to the supporting block by three adjusters, the supporting block drives the holder by the three adjusters, a plane defined by the three holders is parallel to a plane defined by the three adjusters, and vertices of a triangle formed by the three holders corresponds with a triangle formed by the three adjuster.

Embodiment 33

A driving apparatus according to embodiment 32, wherein the adjuster is a parallel-link mechanism.

Embodiment 34

A driving apparatus according to embodiment 32, having a geometrical barycenter of the triangle formed by the three holder nearly corresponds with the barycenter of the optical element except in a direction perpendicular to a plane formed by the triangle.

Embodiment 35

A driving apparatus according to embodiment 32, wherein the three holder arranges circular cone hole part, V-shaped groove and plane part onto one side of the optical element or the supporting block, and connects to three protrusions arranged onto the other side.

Embodiment 36

A driving apparatus according to embodiment 32, wherein the three holder arranges circular cone hole part, "V" shape channel and plane part onto one side of the optical element or the supporting block, and connects a sphere fit in the three circular cone hole part arranged onto the other side.

Embodiment 37

A driving apparatus according to embodiment 32, wherein the three holder arranges three V-shaped grooves on one side of the optical element or the supporting block, and connects the three V-shaped grooves to the other side of a sphere matched to three circular cone hole parts.

Embodiment 38

A driving apparatus according to embodiment 32, wherein a geometrical barycenter of the triangle formed by the three adjuster nearly corresponds with the barycenter formed by the optical element, the holder, and the supporting block, except for a vertical direction to a plane formed by the triangle.

Embodiment 39

A driving apparatus according to one of embodiments 23 to 38, wherein the optical element is a reflecting optical element.

Embodiment 40

An exposure apparatus comprising a driving apparatus according to one of embodiments 23 to 39.

Embodiment 41

An exposure apparatus comprising: an illuminating optical system for introducing light from a light source to a mask (or reticle); and a projecting optical system introducing the light via the mask onto an object to be processed,
  wherein the driving apparatus drives an optical element of the illuminating optical system and/or the projecting optical system.

Embodiment 42

An exposure apparatus according to embodiment 40, wherein light from the light source is EUV light (e.g. light of wavelength 10 to 15 nm).

Embodiment 43

A device fabricating method comprising the steps of: exposing an object by an exposure apparatus according to embodiments 40 to 42; and
  developing the exposed object.

What is claimed is:

1. A driving apparatus comprising:
  an optical element;
  a supporting block configured to contact and support the optical element at three supporting contact areas; and
  a driving mechanism configured to contact and drive the supporting block at three driving contact areas,
  wherein each of the three supporting contact areas is disposed at the same position as that of one of the three corresponding driving contact areas, and
  wherein the driving mechanism comprises a base block and three linkage mechanisms, each linkage mechanism being coupled to one of the driving contact areas, the driving mechanism being configured to drive the supporting block relative to the base block in six degrees of freedom.

2. A driving apparatus according to claim 1, wherein each of the three linkage mechanisms comprises two actuators.

3. A driving apparatus according to claim 1, wherein the optical element is a mirror configured to reflect extreme ultraviolet light having a wavelength of 10 to 15 nm, and
  wherein the driving apparatus is used in a vacuum atmosphere.

4. An exposure apparatus configured to expose a pattern of a mask onto an object to be exposed, said exposure apparatus comprising:
  an illumination optical system configured to illuminate the mask; and
  a projection optical system configured to project the pattern of the mask onto the object,
  wherein at least one of the illumination optical system and the projection optical system includes an optical element, a supporting block configured to contact and support the optical element at three supporting contact areas, and a driving mechanism configured to contact and drive the supporting block at three driving contact areas,
  wherein each of the three supporting contact areas is disposed at the same position as that of one of the three corresponding driving contact areas, and wherein the driving mechanism comprises a base block and three linkage mechanisms, each linkage mechanism being coupled to one of the driving contact areas, the driving mechanism being configured to drive the supporting block relative to the base block in six degrees of freedom.

5. A device manufacturing method comprising the steps of:
exposing a substrate using an exposure apparatus according to claim 4; and developing the substrate that has been exposed.

* * * * *